United States Patent [19]
Iwasa

[11] Patent Number: 5,478,768
[45] Date of Patent: Dec. 26, 1995

[54] METHOD OF MANUFACTURING A SEMICONDUCTOR MEMORY DEVICE HAVING IMPROVED HOLD CHARACTERISTIC OF A STORAGE CAPACITOR

[75] Inventor: Shinya Iwasa, Tokyo, Japan

[73] Assignee: NEC Corporation, Japan

[21] Appl. No.: 315,850

[22] Filed: Sep. 30, 1994

Related U.S. Application Data

[62] Division of Ser. No. 99,609, Jul. 30, 1993, abandoned.

[30] Foreign Application Priority Data

Aug. 3, 1992 [JP] Japan .................................. 4-206358

[51] Int. Cl.⁶ .................................................. H01L 21/8242
[52] U.S. Cl. ............................ 437/52; 437/47; 437/60; 437/233; 437/919
[58] Field of Search .................................. 257/297, 298, 257/300, 306, 307, 308, 309, 310, 311, 296, 508, 748, 754, 756, 758, 775; 437/47, 48, 52, 60, 233, 919; 156/643

[56] References Cited

U.S. PATENT DOCUMENTS

| | | | |
|---|---|---|---|
| 4,951,175 | 8/1990 | Kurosawa | 257/306 |
| 5,023,683 | 6/1991 | Yamada | 257/309 |
| 5,041,887 | 8/1991 | Kumagai et al. . | |
| 5,047,817 | 9/1991 | Eimori et al. . | |
| 5,059,548 | 10/1991 | Kim | 257/307 |
| 5,114,873 | 5/1992 | Kim et al. . | |
| 5,126,280 | 6/1992 | Chan et al. | 257/309 |
| 5,140,389 | 8/1992 | Hashimoto et al. . | |
| 5,175,121 | 12/1992 | Choi et al. . | |
| 5,180,683 | 1/1993 | Eimori et al. . | |
| 5,194,753 | 3/1993 | Kumagai et al. . | |
| 5,243,220 | 9/1993 | Shibata et al. | 257/758 |
| 5,294,561 | 3/1994 | Tanigawa | 437/60 |
| 5,389,560 | 4/1995 | Park | 437/52 |

*Primary Examiner*—Tom Thomas
*Attorney, Agent, or Firm*—Laff, Whitesel, Conte & Saret

[57] ABSTRACT

In a semiconductor memory device comprising a plurality of memory cells each including a switching transistor having a gate electrode and source/drain regions, one or more interlayer insulating layers are deposited on the surface of the substrate. A first conductive layer is deposited on the entire surface of the interlayer insulating layers. The first conductive layer has an etching rate slower than that of the interlayer insulating layers. A first coating film is formed on the entire surface of the first conductive layers. The first coating film and the first conductive layer on the source region are selectively removed by photolithography process to form an opening. A second coating film is formed in the opening to form a spacer on the inner side wall of the opening. The second coating film has an etching rate slower than that of the interlayer insulating layer. A contact hole is made on the source region using the first conductive layer and the spacer as a mask. A second conductive layer is formed in the contact hole and on the surface of the first conductive layer. The second conductive layer makes ohmic contact with the first conductive layer and the source region. The first conductive layer and the second conductive layer are patterned to form a storage electrode of a storage capacitor.

5 Claims, 6 Drawing Sheets

METHOD OF MANUFACTURING A SEMICONDUCTOR MEMORY DEVICE HAVING IMPROVED HOLD CHARACTERISTIC OF A STORAGE CAPACITOR

This application is a division, of application Ser. No. 08/099,609, filed Jul. 30, 1993 now abandoned.

BACKGROUND OF THE INVENTION

This invention relates to a semiconductor memory device and a method of manufacturing the semiconductor memory device and, in particular, to a capacitor structure of a dynamic random access memory (DRAM) and a method of forming the capacitor structure thereof.

"Semiconductor" devices are fabricated from various materials which either electrically conductive, electrically nonconductive or electrically semiconductive. Silicon (Si), the most commonly used semiconductor material can be made conductive by doping it (introducing an impurity into the silicon crystal structure) with either an element such as boron (B) which has one less valence electron than silicon, or with an element such as phosphorus (P) or arsenic (As) which have one more valence electron than silicon. In the case of boron doping, electron "holes" become the charge carriers and the doped silicon is referred to as positive or P-type silicon. In the case of phosphorus or arsenic doping, the additional electrons become the charge carriers and the doped silicon is referred to as negative or N-type silicon. If a mixture of dopants having opposite conductivity type is used, counter doping will result, and the conductivity type of the most abundant impurity will prevail. Silicon is used either in single-crystal or polycrystalline form. Polycrystalline silicon is referred to hereinafter as "polysilicon".

Various semiconductor memory devices are already known.

U.S. Pat. No. 5,041,887 issued Aug. 20, 1991 to Kumagai et al, entitled "SEMICONDUCTOR MEMORY DEVICE" described, a semiconductor memory device including dynamic memory cells each being comprised of one transistor having source and drain regions and one cell capacitor. The cell capacitor with a reduced junction leakage current comprises a MOS capacitor which is provided between a semiconductor substrate and a charge storage electrode disposed at a side wall of a trench through a first insulating film, and a stacked capacitor which is provided between the charge storage electrode and a capacitor plate electrode formed on a second insulating film covering the entire surface of the charge storage electrode. The equivalent silicon dioxide thickness of the first insulating film is thicker than that of the second insulating film, and the storage capacitance of the cell capacitor is rendered by a sum of the capacitance of the MOS capacitor and the capacitance of the stacked capacitor because these capacitors are electrically connected in parallel with each other.

U.S. Pat. No. 5,047,817 issued Sep. 10, 1991 to Eimori et al, entitled "STACKED CAPACITOR FOR SEMICONDUCTOR MEMORY DEVICE" and division of this patent, U.S. Pat. No. 5,180,683 issued Jan. 19, 1993 to Eimori et al, entitled "METHOD OF MANUFACTURING STACKED CAPACITOR TYPE SEMICONDUCTOR MEMORY DEVICE; INCREASED STORAGE CAPACITY", describe a semiconductor memory device which comprises a memory cell having one transistor and one stacked capacitor. The stacked capacitor is stacked on the surface 0f a semiconductor substrate. The stacked capacitor has a structure extending on a gate electrode and a word line through an insulator layer. A lower electrode layer of the capacitor has various concave/convex shapes, i.e. step portions and projecting portions formed on the surface thereof. These shapes are made by employing various etching processes. The lower electrode layer has such various concave/convex shapes formed thereon, so that a surface area and capacitance of the capacitor can be increased.

U.S. Pat. No. 5,114,873 issued May 19, 1992 to Kim et al, entitled "METHOD FOR MANUFACTURING A STACKED CAPACITOR DRAM CELL", describes a method of manufacturing a semiconductor device which has a plurality of memory cells, each of which consists of a transistor and a stack capacitor. The method comprises the steps of: forming the transistor of a substrate and then depositing an interlayer insulating layer, and forming a design pattern of a first conductive layer by vertically etching it using a mask, horizontally overetching the pattern by using the etching process used for forming the pattern; depositing a first insulating film and then depositing the second conductive layer to the thickness needed to protect the first insulating film and interlayer insulating layer by applying the mask used in vertically etching the first conductive layer; additionally depositing the second conductive layer; forming a design pattern of the second conductive layer by vertically etching it using a mask; horizontally overetching the pattern of the second conductive layer; depositing the second insulating film and then depositing a third conductive layer to have the thickness to protect the second insulating film; vertically etching the third conductive layer and second insulating film by applying the etching mask of the second conductive layer; and additionally depositing the third conductive layer. The method attains larger effective capacitance in which a plate electrode layer surrounds even the lower surface of the storage electrode layer of the stack capacitor without using an extra mask.

U.S. Pat. No. 5,140,389 issued Aug. 18, 1992 to Hashimoto et al, entitled "SEMICONDUCTOR MEMORY DEVICE HAVING STACKED CAPACITOR CELLS", describes a semiconductor memory device having STC cells wherein the major portions of active regions consisting of channel-forming portions are inclined at an angle of 45 degrees with respect to word lines and bit lines that meet at right angle with each other, thereby enabling the storage capacitor portions to be arranged very densely and a sufficiently large capacitance to be maintained with very small cell areas. Since the storage capacitor portions are formed even on the bit lines, the bit lines are shielded, so that the capacitance decreases between the bit lines and, hence, the memory array noise decreases. It is also possible to design the charge storage capacitor portion so that a part thereof is in the form of a wall substantially vertical to the substrate in order to increase the capacitance.

U.S. Pat. No. 5,175,121 issued Dec. 29, 1992 to Choi et al, entitled "METHOD FOR MANUFACTURING A STACKED CAPACITOR DRAM SEMICONDUCTOR DEVICE", describes a method for manufacturing a semiconductor device which includes selectively doping an impurity into the surface of a semiconductor substrate. An insulating layer is deposited and selectively etched to form a contact hole through which an area of the impurity-doped region is exposed. An epitaxial layer is then grown using the exposed surface of the impurity doped region as a seed. Finally, a conductive layer is deposited upon the epitaxial layer.

U.S. Pat. No. 5,194,753 issued Mar. 16, 1993 to Kumagai et al, entitled "SEMICONDUCTOR MEMORY DEVICE", describes a semiconductor memory device including an array of dynamic memory cells. The cell regions for cell transistor pairs are provided in a semiconductor substrate so as to be crossed by one desired bit line and two word lines adjacent thereto, and the patterns of cell regions have a same direction. Contacts for electrically connecting each bit line to common regions of cell transistor pairs are provided on respective bit lines every desired pitch at positions where each bit line intersects with cell regions. These contacts of adjacent bit lines are successively shifted in a bit line direction by approximately (½)n pitch where n represents a natural number greater than or equal to two.

With the large-scale integration in the DRAM, it is necessary to reduce the area of a memory cell in the DRAM. For that purpose, it has been attempted to enlarge the ratio of storage capacitance of the memory cell to the area of the memory cell. In this event, miniaturization has been facilitated in a contact hole. In particular, in the DRAM having a stacked capacitor (STC) structure, a C.O.B (Capacitor Over Bitline) cell structure has been adopted in a 16 Mbit DRAM. The C.O.B cell structure is a structure where a storage capacitor is formed upon a bit line in order to ensure the storage capacitance of the memory cell and to deal with noise between lines. In addition, with the miniaturization of the contact hole, a contact hole with a space on a side wall thereof has been designed.

In general, a semiconductor memory device such as the DRAM of stacked type comprises a plurality of memory cells each of which includes a switching transistor and a storage capacitor. The switching transistor has a gate electrode and a pair of source/drain regions. The gate electrode selectively coats or covers the surface of a semiconductor substrate such as a P-type Si substrate through a gate insulating layer. The pair of source/drain regions is formed on the surface portion on the semiconductor substrate with a channel region under the gate electrode inserted between the source/drain regions. The storage capacitor selectively coats or covers the surface of at least one interlayer insulating layer which coats or covers the switching transistor. The storage capacitor has a storage electrode, which consists, for example, of a polysilicon layer, for connecting with one of the source/drain regions through a contact hole.

In a conventional semiconductor memory device, the contact hole for electrically connecting the storage electrode with the above-mentioned one of the source/drain regions is formed on the above-mentioned one of the source/drain regions by an anisotropic dry etching process and an insulating spacer is formed on the inner side wall of the contact hole by another anisotropic dry etching process after a coating film with good step coverage is grown on the whole surface of the substrate.

In the manner which will later become clear as the description proceeds in conjunction with FIGS. 1A to 1C, a conventional method of forming the contact hole for electrically connecting the storage electrode with the above-mentioned one of the source/drain regions results in increasing of a junction leakage current in the contact portion between the switching transistor and the storage capacitor. This is because there is an insufficient diffusion of impurities to the P-type Si substrate in the vicinity of the above-mentioned one of the source/drain regions by diffusing phosphorus (P) in the polysilicon layer of the storage electrode due to a high aspect ratio. As a result, it is necessary to form an impurity diffusion layer using ion implantation after making the contact hole. However, it is difficult to perform sufficient ion implantation if the contact hole is made with the contact hole ranged to the gate electrode. This is because the ion implantation for decreasing the junction leakage current results in changing of a characteristic of the switching transistor. In addition, in the conventional method of forming the contact hole, crystal defects occurs in the above-mentioned one of the source/drain regions due to both the anisotropic dry etching process for forming the contact hole and the anisotropic dry etching process for forming the insulating spacer on the inner side wall of the contact hole. Accordingly, it is difficult to sufficiently decrease the junction leakage current, resulting in deterioration in a hold characteristic of the storage capacitor.

SUMMARY OF THE INVENTION

It is therefore an object of this invention to provide a semiconductor memory device which is capable of effectively decreasing a junction leakage current in the contact portion between a switching transistor and a storage capacitor.

It is another object of this invention to provide a semiconductor memory device of the type described, which is capable of preventing deterioration in a hold characteristic of the storage capacitor.

Other object of this invention will become clear as the description proceeds.

According to an aspect of this invention, a semiconductor memory device comprises a plurality of memory cells each of which includes a switching transistor and a storage capacitor having a storage electrode. Each of the memory cells comprises a semiconductor substrate having a principal surface. A field oxide layer is formed on the principal surface and defines an element forming region. A gate insulating layer is formed on the element forming region. A gate electrode selectively coats the gate insulating layer. A pair of source/drain regions is formed under the principal surface with a channel region under the gate electrode and between the source/drain regions. The source/drain regions are self-aligned to the gate electrode, thereby forming the switching transistor which comprises the gate electrode and the source/drain regions. At least one interlayer insulating layer covers the switching transistor and has a contact hole on one of the source/drain regions. A first conductive layer selectively coats the surface of the interlayer insulating layer and has an opening over the above-mentioned one of the source/drain regions. A spacer is formed on the inner side wall of the opening of the first conductive layer. The opening with the spacer is self-aligned to the contact hole. A second conductive layer is filled in the contact hole and covers a surface of the spacer and the surface of the first conductive layer, thereby resulting in the storage electrode.

Preferably, the spacer may have a height higher than a thickness of the first conductive layer.

In the semiconductor memory device, each of the memory cells may further comprise a capacitor insulating layer coating the storage electrode and a plate electrode deposited on the surface of the capacitor insulating layer.

According to another aspect of this invention, a method of manufacturing the semiconductor memory device of the type described is provided. It comprises the steps of: forming the switching transistor on the surface of a semiconductor substrate, the switching transistor having a gate electrode and source/drain regions, the gate electrode selectively coating the surface of the semiconductor substrate via a gate insulating layer, the source/drain regions being diffused into the semiconductor substrate with a channel region under the gate electrode inserted between the source/drain regions; depositing at least one interlayer insulating layer on the surface of the substrate; depositing a first conductive layer on the entire surface of a top layer in the interlayer insulating layer, the first conductive layer having an etching rate slower than that of the interlayer insulating layer; forming a first coating film on the entire surface of the first conductive layer; selectively removing the first coating film and the first conductive layer over one of the source/drain regions of the switching transistor by photolithography process to form an opening having a predetermined pattern; forming a second coating film in the opening to form a spacer on the inner side wall of the opening, the second coating film having an etching rate slower than that of the interlayer insulating layer; making a contact hole on the above-mentioned one of the source/drain regions using the first conductive layer and the spacer as a mask; forming a second conductive layer in the contact hole and on the surface of the first conductive layer, the second conductive layer making ohmic contact with the first conductive layer and the above-mentioned one of the source/drain regions; and patterning the first conductive layer and the second conductive layer, thereby forming the storage electrode.

The method may further comprise the steps of: coating the storage electrode with a capacitor insulating layer; and depositing a plate electrode on the surface of the capacitor insulating layer.

DESCRIPTION OF THE PREFERRED EMBODIMENTS

Figure 1A:
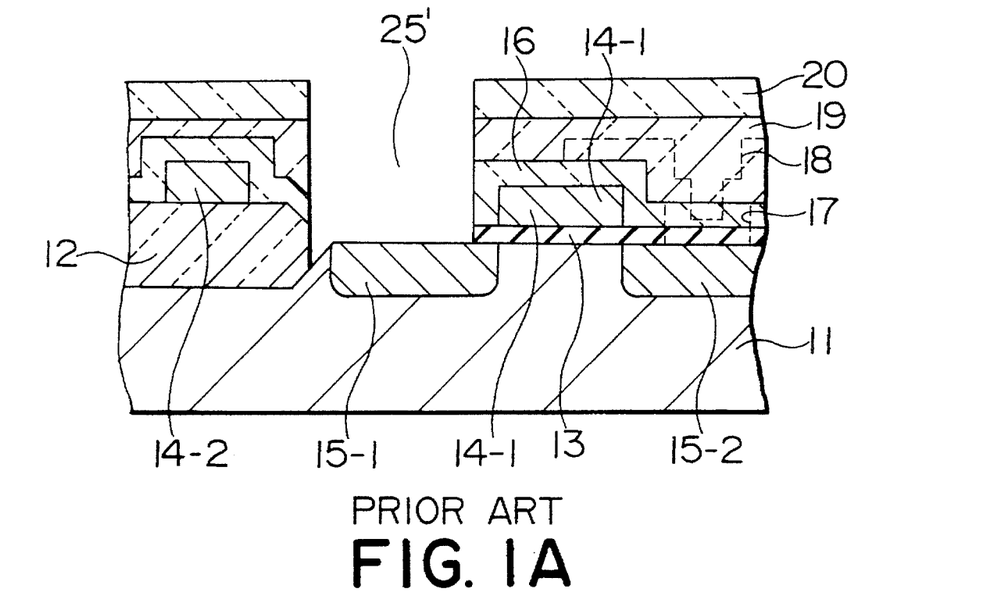
FIGS. 1A to 1C illustrate the manufacturing process sequence of a conventional semiconductor memory device.
Figure 1B:
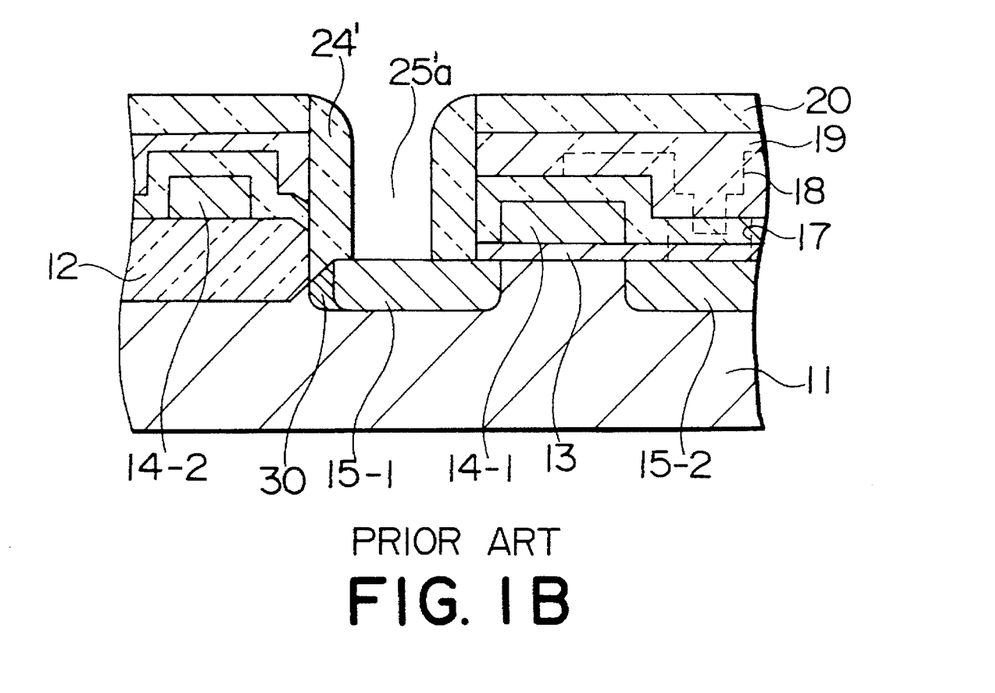
Figure 1C:
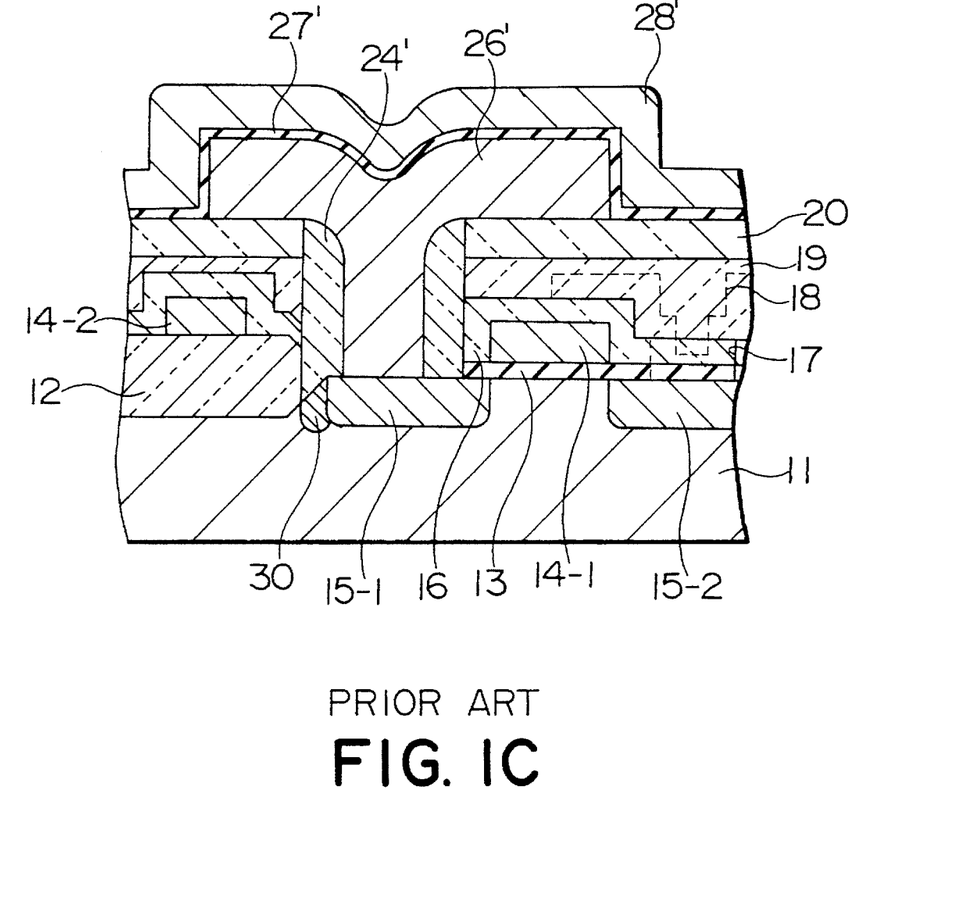

Referring to FIGS. 1A to 1C, a manufacturing method of a conventional semiconductor memory device will first be described in order to facilitate an understanding of the present invention. The illustrated semiconductor memory device is a stacked capacitor type DRAM cell having a contact with high aspect.

As shown in FIG. 1A, a P-type Si substrate 11 is prepared in a known manner and has the principal surface 11a which is directed upwards of FIG. 1A. A field oxide layer 12 is formed on the principal surface 11a by means of the LOCOS (local oxidation of silicon) process which is well known in the art. The field oxide layer 12 defines an element forming region on which a gate insulating layer 13 and a gate electrode 14-1 are successively formed. Another gate electrode 14-2 is formed on the field oxide layer 12. Subsequently, an N-type impurity is diffused in both side of the gate electrode 14-1 to form a source region 15-1 and a drain region 15-2 in a self-alignment fashion. A first interlayer insulating layer 16 is deposited on the entire surface of the substrate 11. A contact hole 17 is formed on the drain region 15-2 and a bit line 18 is formed in the contact hole 17.

Second and third interlayer insulating layers 19 and 20 are successively deposited on the entire surface of the first interlayer insulating layer 16 and then a contact hole 25' is formed on the source region 15-1 by an anisotropic dry etching process. In this event, the contact hole 25' can not ensure sufficient margin regarding to the source region 15-1 and the gate electrode 14-1 due to a limitation of resolution in photolithography technique. As a result, the contact hole 25' is holed in the field oxide layer 12 as shown in FIG. 1A.

Turning to FIG. 1B, an N-type impurity is diffused inside the contact hole 25' to form an impurity diffusion layer 30. It results in decreasing a junction leakage current between the switching transistor and a storage capacitor. A coating film (not shown) with good step coverage is grown on the entire surface of the substrate 11 and then an anisotropic dry etching process is carried out thereto to form an insulating spacer 24' on the inner side wall of the contact hole 25', thereby to form a contact hole 25'a.

Turning to FIG. 1C, a storage electrode 26' having a predetermined pattern is formed in the contact hole 25'a, a capacitor insulating layer 27' and a plate electrode 28' are successively deposited and patterned to form the storage capacitor.

In the method of forming the contact hole 25'a for electrically connecting the storage electrode 26' with the source region 15-1, with high aspect ratio of the contact hole 25'a, there is an insufficient diffusion of impurities to the P-type Si substrate 11 in the vicinity of the source region 15-1 by diffusing phosphorus (P) in the poly-Si layer which composes the storage electrode 26'. It therefore results in increasing the junction leakage current. As a result, it is necessary to form the impurity diffusion layer 30 using ion implantation after making the contact hole 25'. When the contact hole 25' is made with the contact hole ranged to the gate electrode 14-1, it is difficult to carry out sufficient ion implantation. This is because a characteristic of the switching transistor changes due to the ion implantation for decreasing the junction leakage current.

In addition, in the method of forming the contact hole 25'a, crystal defects occurs in the source region 15-1 due to both of the anisotropic dry etching for forming the contact hole 25' and the anisotropic dry etching for forming the insulating spacer 24' on the inner side wall of the contact hole 25'. Accordingly, it is difficult to sufficiently decrease the junction leakage current thereby to result in deterioration in a hold characteristic of the storage capacitor.

EXAMPLE 1

Referring to FIGS. 2A to 2F, description will be made as regards a method of manufacturing a semiconductor memory device according to a first embodiment of the present invention. The semiconductor memory device is a stacked capacitor type dynamic random access memory (DRAM).

Figure 2A:
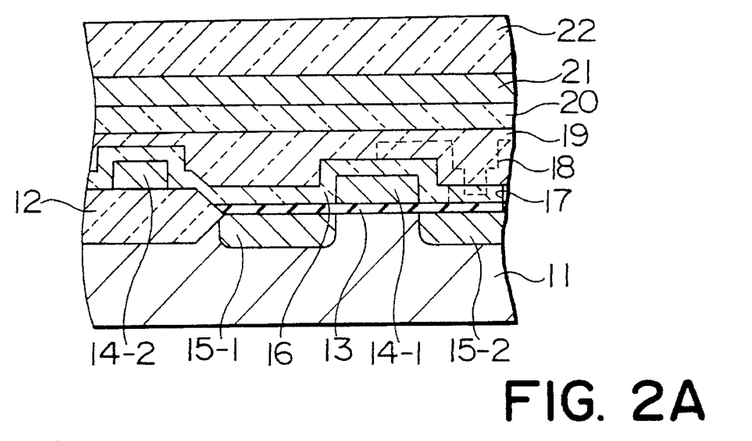
FIGS. 2A to 2F illustrate the improved manufacturing process sequence of a semiconductor memory device according to a first embodiment of the present invention.

As shown in FIG. 2A, a P-type silicon substrate 11 is prepared in a known manner and has the principal surface 11a which is directed upwards of FIG. 2A. A field oxide layer 12 is formed on a separate region of the principal surface 11a using the LOCOS (local oxidation of silicon) method to define an element forming area. A gate insulating layer 13 is formed on the element forming area in the manner well known in the art. Gate electrodes 14-1 and 14-2 are formed on the gate insulating layer 13 and on the field oxide layer 12, respectively, in the manner well known in the art. Each of the gate electrodes 14-1 and 14-2 may be composed of polysilicon or the like.

Subsequently, source and drain regions 15-1 and 15-2 of N+ type are formed under the principal surface 11a of the P-type silicon substrate 11 by implanting ions of an N-type impurity such as phosphorus (P) or arsenic (As) using the gate electrode 14-1 and the field oxide layer 12 as a mask with the source and the drain regions 15-1 and 15-2 self-aligned to the gate electrode 14-1. "N+" means that the N-type impurity is relatively heavily doped. As a result, a switching transistor is formed on the surface of the substrate 11. That is, the switching transistor has the gate electrode 14-1 for selectively coating the surface of the substrate 11 via the gate insulating layer 13 and the source and the drain regions 15-1 and 15-2 which are diffused into the substrate 11 with a channel region (not shown) of the lower part in the gate insulating electrode 13 inserted between the source and the drain regions 15-1 and 15-2.

A first interlayer insulating layer 16 of silicon dioxide is then deposited on the entire surface of the substrate 11 to a thickness of about 100 nm by a known CVD (chemical vapor deposition) process. The first interlayer insulating layer 16 on the drain region 15-2 is selectively etched to form a contact hole 17 and a bit line 18 is formed in the manner well known in the art. A BPSG (boron-doped phospho-silicate-glass) layer with high reflow is grown on the entire surface of the first interlayer insulating layer 16 to a thickness of about 400 to 600 nm by a heat treatment, thereby to form a second interlayer insulating layer 19.

Thereafter a silicon dioxide layer is grown on the entire surface of the second interlayer insulating layer 19 to a thickness of about 100 nm in the manner well known in the art to form a third interlayer insulating layer 20. In this embodiment, the first through the third interlayer insulating layers 16, 19 and 20 are deposited on the surface of the substrate 11 whereon the transistor has been formed. At least one interlayer insulating layer may be deposited on the surface of the substrate 11 whereon the transistor has been formed.

A first conductive layer 21 is deposited on the entire surface of the third interlayer insulating layer 20 to a thickness of about 100 to 200 nm in the manner well known in the art. The first conductive layer 21 is, for example, a polysilicon layer and has an etching rate for an anisotropic dry etching that is slower than that of the first through the third interlayer insulating layers 16, 19 and 20. A first coating film 22 is formed on the entire surface of the first conductive layer 21 by the CVD process. The first coating film 22 is composed, for example, of silicon dioxide.

Figure 2B:
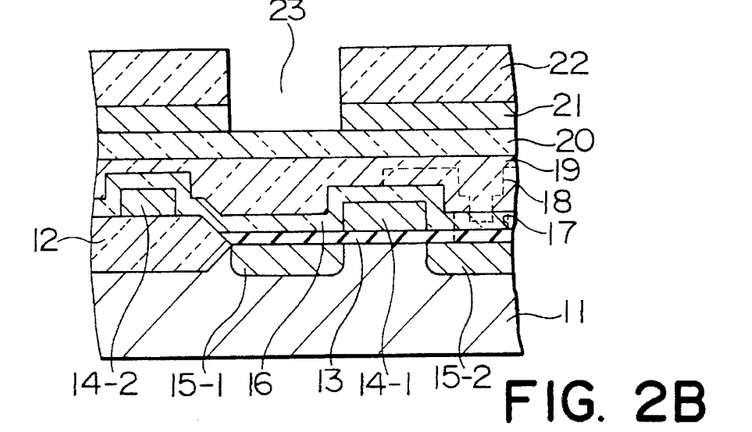

Turning to FIG. 2B, the first coating film 22 and the first conductive layer 21 over the source region 15-1 of the switching transistor are successively etched through the use of the well-known anisotropic dry etching process by photolithography process, thereby to form an opening 23 having a predetermined pattern.

Figure 2C:
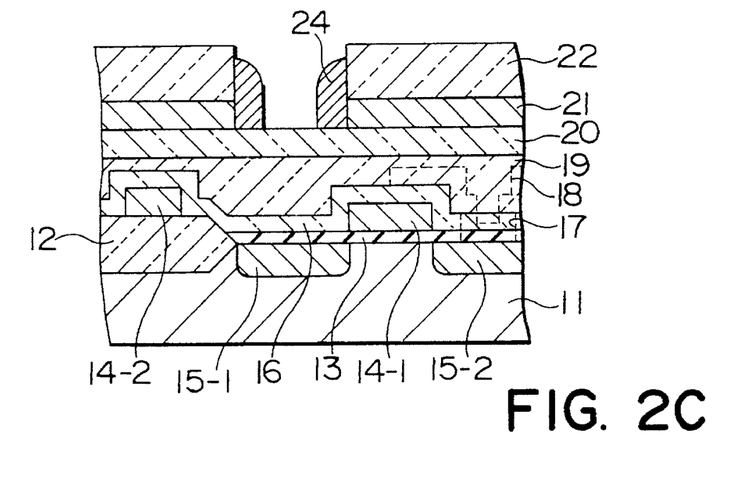

Turning to FIG. 2C, a second coating film is grown on the first coating film 22 and in the opening 23 by the CVD process. The second coating film has an etching rate which is slower than that of the first through the third interlayer insulating layers 16, 19 and 20. The second coating film is a conductive film or an insulating film having a good step coverage that is composed, for example, of polysilicon or silicon nitride. The second coating film is etched through the use of the anisotropic dry etching process using the first coating film 22 as a mask, thereby to form a spacer 24 on the inner side wall of the opening 23 as shown in FIG. 2C.

Figure 2D:
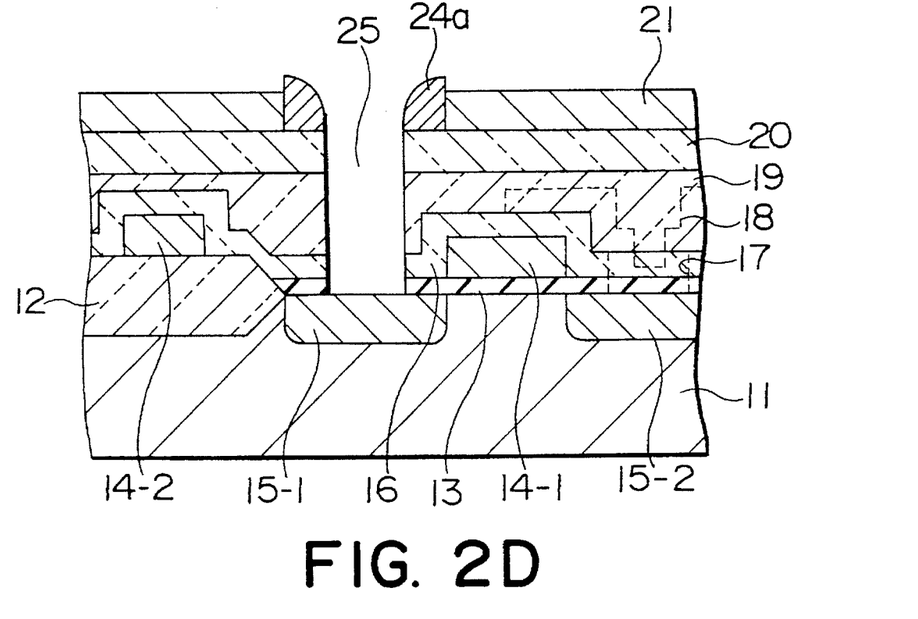

Turning to FIG. 2D, the first through the third interlayer insulating layers 16, 19 and 20 are etched through the use of the anisotropic dry etching process using the polysilicon layer 21 and the spacer 24 as a mask, thereby to make a contact hole 25 on the source region 15-1. At the same time, the first coating film 22 is etched but the first through the third interlayer insulating layers 16, 19 and 20 are protected. This is because the polysilicon layer 21 has a relatively lower etching rate. Height of the spacer 24 becomes lower and then results in a spacer 24a having a lower height.

Figure 2E:
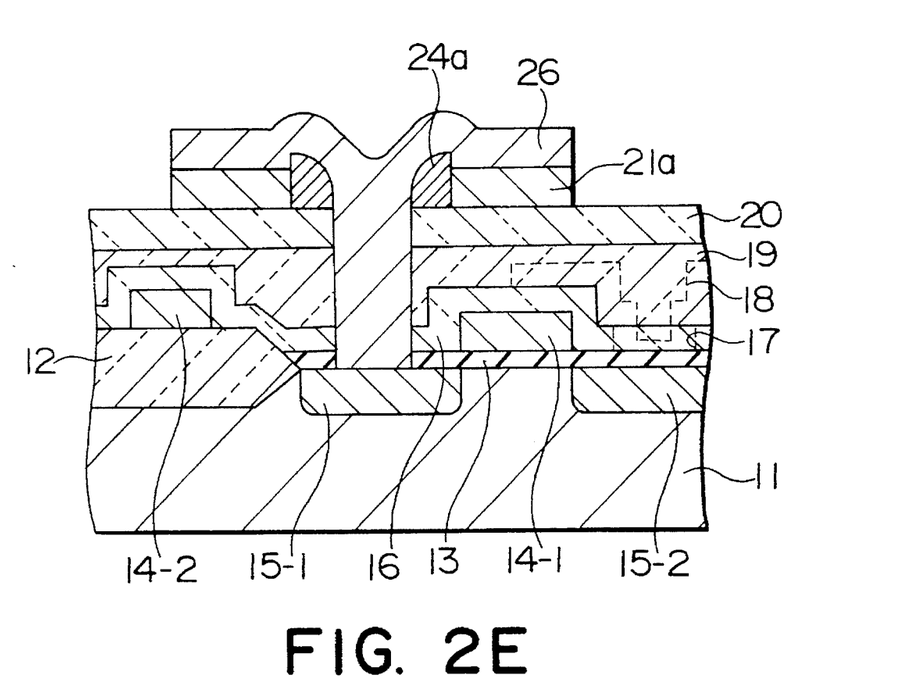

Turning to FIG. 2E, a polysilicon layer is grown in the contact hole 25 and on the surface of the first conductive layer 21 to a thickness of about 200 nm by the CVD process and then diffusion of phosphorus is carried out thereon to form a second conductive layer 26. The second conductive layer 26 makes ohmic contact with the first conductive layer 21 and the source region 15-1. The first and the second conductive layers 21 and 26 are simultaneously etched through the use of the anisotropic dry etching process by photolithography process, thereby to form a storage electrode which consists of the first and the second conductive layers 21a and 26 as shown in FIG. 2E.

Figure 2F:
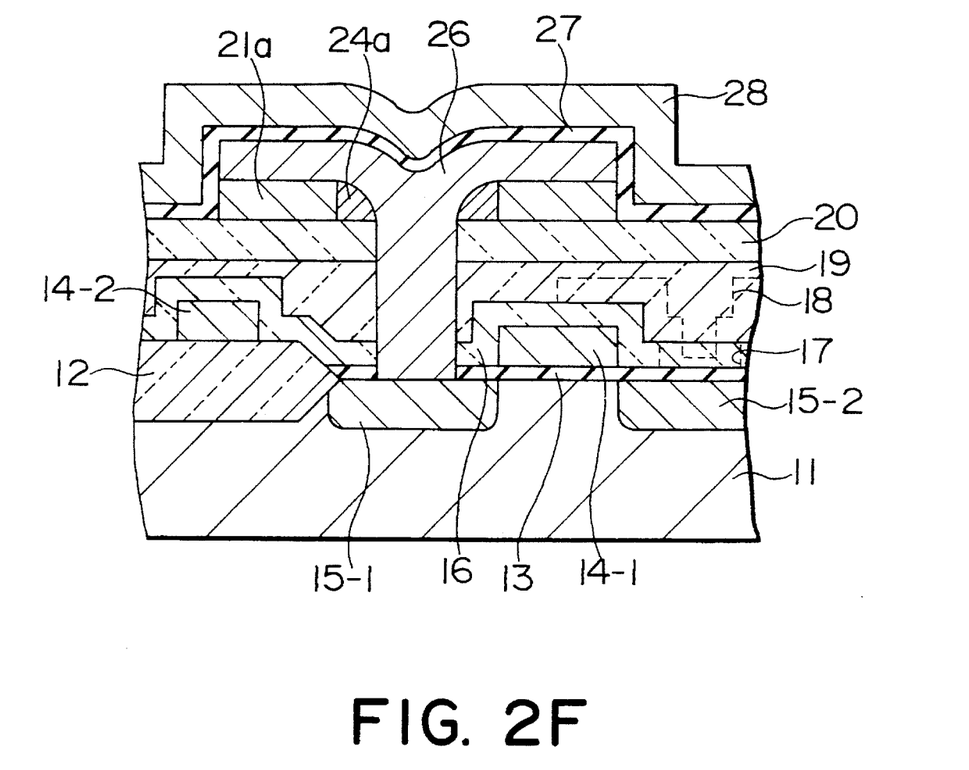

Turning to FIG. 2F, the storage electrode is coated with a capacitor insulating layer 27 in the manner well known in the art. A plate electrode 28 of polysilicon layer is deposited on the surface of the capacitor insulating layer 27 before diffusion of phosphorus is carried out thereon and is patterned into a predetermined shape by photolithography process.

Inasmuch as the contact hole 25 is formed after the opening 23 is made in the first conductive layer 21 formed on the third interlayer insulating layer 20 and as the spacer 24a is formed on the inner side wall of the opening 23, it is easy to ensure margin between the contact hole 25 and the source region 15-1. In addition, it is possible to avoid causing damage to the circumference of the source region 15-1 on etching. As a result, a junction leakage current between the contact portion between the switching transistor and the storage capacitor is decreased to improve the hold characteristic of the storage capacitor.

EXAMPLE 2

Figure 3:
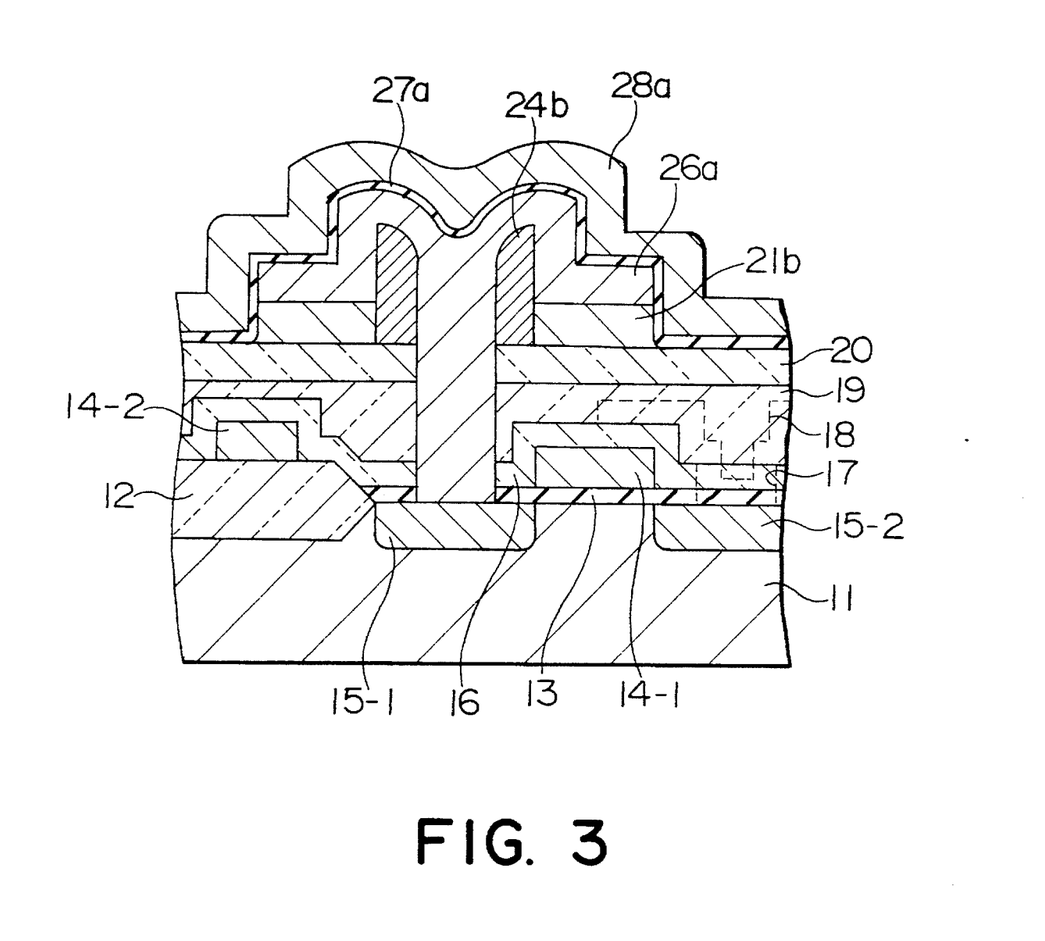
FIG. 3 is a cross-sectional view of a semiconductor memory device according to a second embodiment of the present invention.

Referring to FIG. 3, a semiconductor memory device according to a second embodiment of the present invention is similar in structure to that illustrated in FIG. 2F except that a spacer 24b is projected in an upward direction from a first conductive layer 21b compared with the spacer 24a shown in FIG. 2F. With this structure, a second conductive layer 26a has a wider surface area than that of the second conductive layer 26 shown in FIG. 2F. It is therefore possible to make storage capacitance of the storage capacitor larger. Such a structure can be realized by making a thickness of the first coating film 22 formed on the polysilicon layer 21 as shown in FIG. 2B thicker compared with both of an over-etching amount by the anisotropic dry etching process for forming the spacer 24 on the inner side wall of the opening 23 and an etching amount for the spacer 24 by the anisotropic dry etching process for forming the contact hole 25.

While this invention has thus far been described in conjunction with a few embodiments thereof, it will now be readily possible for those skilled in the art to put this invention into practice in various other manners.

What is claimed is:

1. A method of manufacturing a semiconductor memory device comprising a plurality of memory cells each of which includes a switching transistor and a storage capacitor having a storage electrode, comprising the steps of:

(a) forming said switching transistor on the surface of a semiconductor substrate, said switching transistor having a gate electrode and source/drain regions, said gate electrode selectively coating the surface of said semiconductor substrate via a gate insulating layer, said source/drain regions being diffused into the semiconductor substrate with a channel region under said gate electrode inserted between said source/drain regions;

(b) depositing at least one interlayer insulating layer on the surface of said substrate whereon the transistor has been formed in step (a);

(c) depositing a first conductive layer on the entire surface of a top layer in said interlayer insulating layer, said first conductive layer having an etching rate slower than that of said interlayer insulating layer;

(d) forming a first coating film on the entire surface of said first conductive layer;

(e) selectively removing said first coating film and said first conductive layer over one of said source/drain regions of said switching transistor by photolithography process to form an opening having a predetermined pattern;

(f) forming a second coating film in said opening to form a spacer on the inner side wall of said opening, said second coating film having an etching rate slower than that of said interlayer insulating layer;

(g) making a contact hole on said one of the source/drain regions using said first conductive layer and said spacer as a mask;

(h) forming a second conductive layer in said contact hole and on the surface of said first conductive layer whereon the contact hole has been formed in step (g), said second conductive layer making ohmic contact with said first conductive layer and said one of the source/drain regions; and (i) patterning said first conductive layer and said second conductive layer, thereby forming said storage electrode.

2. A method as claimed in claim 1, further comprising the steps of:

(j) coating said storage electrode with a capacitor insulating layer; and (k) depositing a plate electrode on the surface of said capacitor insulating layer.

3. A method of manufacturing a semiconductor device including a plurality of memory cells, each memory cell having a transistor and a capacitor, said method comprising the steps of:

forming said transistor on a semiconductor substrate, said transistor having source and drain regions selectively formed in said semiconductor substrate and a gate formed on a gate insulating film covering a portion of said semiconductor substrate between said source and drain regions;

forming an interlayer insulating layer covering said semiconductor substrate having said transistor;

forming a first polysilicon layer on said interlayer insulating layer;

removing a portion of said first polysilicon layer without substantially etching said interlayer insulating layer in order to form a first hole in said first polysilicon layer, said first polysilicon having a sidewall surface defining said first hole and a portion of said insulating layer located over one of said source and drain regions, said one of said source and drain regions being exposed by said first hole;

depositing a second polysilicon layer over an entire surface and etching back said second polysilicon to form a spacer in contact with said sidewall surface of said first polysilicon, said spacer further being in contact with a part of said portion of said interlayer insulating layer to define a second hole for exposing a remaining part of said portion of said interlayer insulating layer;

selectively removing said interlayer insulating layer by using said spacer as a mask to form a third hole in said interlayer insulating layer, said third hole exposing a part of said one of said source and drain regions and having a size which is substantially the same as the size of said second hole;

forming a third polysilicon layer which fills said second and third holes and is in contact with said spacer and said first polysilicon layer;

patterning said first and third polysilicon layers to form a lower electrode of said capacitor;

forming a dielectric film of said capacitor on said lower electrode; and forming an upper electrode of said capacitor on said dielectric film.

4. A method of manufacturing a semiconductor device including a plurality of memory cells, each of said memory cells having a transistor and a capacitor, said method comprising the steps of:

forming said transistor in a semiconductor substrate, said transistor having source and drain regions selectively formed in said semiconductor substrate and a gate formed on a gate insulating film covering a portion of said semiconductor substrate between said source and drain regions;

forming a first insulating layer to cover said semiconductor substrate having said transistor;

forming a first hole in said first insulating film to expose a part of one of said source and drain regions;

forming a bit line in contact through said first hole, said contact being with said part of said one of said source and drain regions;

forming a second insulating film on said first insulating film and said bit line;

forming a first polysilicon layer on said second insulating film;

forming a second hole in said first polysilicon layer by selectively removing said first polysilicon layer without substantially etching said second insulating film, said second hole being defined by a sidewall surface of said first polysilicon layer and exposing a portion of said second insulating film located over the other of said surface and drain regions;

forming a spacer made of polysilicon in contact with said sidewall of said first polysilicon layer, said spacer being further in contact with a part of said portion of said second insulating film and defining a third hole exposing a remaining part of said portion of said second insulating film;

forming a fourth hole in said first and second insulating film by selectively removing said first and second insulating films by using said spacer as a mask, said fourth hole having a size which is substantially the same as the size of said third hole and exposing a part of said other of said source and drain regions;

depositing a second polysilicon layer on said spacer and said first polysilicon layer with a resulting filling of said fourth hole; and patterning said first and second polysilicon layers to form a lower electrode of said capacitor, said first and second polysilicon layer having substantially the same pattern.

5. The method as claimed in claim 4, wherein said second insulating film includes a boron-doped phosphor-silicate-glass (BPSG) layer, and said BPSG is selectively removed during the step of forming said fourth hole.

* * * * *